United States Patent
Ahn et al.

(10) Patent No.: US 8,119,514 B2
(45) Date of Patent: Feb. 21, 2012

(54) COBALT-DOPED INDIUM-TIN OXIDE FILMS AND METHODS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 11/823,658

(22) Filed: Jun. 28, 2007

(65) Prior Publication Data
US 2009/0004759 A1 Jan. 1, 2009

(51) Int. Cl.
*H01L 21/44* (2006.01)

(52) U.S. Cl. ....... 438/608; 438/3; 438/680; 257/E21.17; 257/E21.665

(58) Field of Classification Search .............. 438/608, 438/3; 257/E21.17, E21.665
See application file for complete search history.

(56) References Cited

U.S. PATENT DOCUMENTS
2006/0087881 A1* 4/2006 Lim .............................. 365/171

OTHER PUBLICATIONS

Stankiewics et al. "Ferromagnetism in Co-doped indium-tin oxide films", J. Magnetism and Magnetic Mater., 310, (2007), pp. 2084-2084-2086.*
Asikainen et al. "Growth of Indium-Tin-oxide Thin Films by Atomic Layer Epitaxy", J.Electrochem. Soc., vol. 142, (1995), pp. 3538-3541.*
L.Falco, "Chemical vapor deposition of magnetic oxide semiconductors for spintronic applications", Ph.D. Thesis, The University of Alabama, Dissertations Abstract International, vol. 6704B, p. 2113, 2005.*
Rooth et al., "Atomic Layer Deposition of Co3O4 Thin Films Using a CoI2/O2 Precursor Combination," Chemical Vapor Deposition, 12, (2006), pp. 209-213.*
Ahn, K Y., "Atomic Layer Deposited Titanium-Doped Indium Oxide Films", U.S. Appl. No. 11/400,836, filed Apr. 7, 2006.
Ahn, Kie Y., "Magnesium-Doped Zinc Oxide Structures and Methods", U.S. Appl. No. 11/706,820, filed Feb. 13, 2007.
Ahn, Kie , et al., "Magnetic Floating Gate Flash Memory Structures", U.S. Appl. No. 11/796,750, filed Apr. 30, 2007.
Ahn, Kie Y., "Molybdenum-Doped Indium Oxide Structures and Methods", U.S. Appl. No. 11/706,944, filed Feb. 13, 2007.
Ahn, Kie Y., et al., "Tungsten-Doped Indium Oxide Structures and Methods", U.S. Appl. No. 11/706,498, filed Feb. 13, 2007.
Ahn, Kie Y., et al., "Zirconium-Doped Zinc Oxide Structures and Methods", U.S. Appl. No. 11/707,173, filed Feb. 13, 2007.
Asikainen, Timo , et al., "Growth of $In_2O_3$ thin films by atomic layer epitaxy", *J. Electrochem. Soc.* vol. 141, (1994),3210-3213.
Du, X , et al., "In situ examination of tin oxide atomic layer deposition using quartz crystal microbalance and Fourier transform infrared techniques", *Journal of Vacuum Science Technology*, 23(4), (2005),581-588.
Lee, H , et al., "High-Quality Cobalt Thin Films by Plasma-Enhanced Atomic Layer Deposition", *Electrochemical and Solid-State Letters*, 9(11), (2006),G323-G325.

(Continued)

*Primary Examiner* — Julia Slutsker
(74) *Attorney, Agent, or Firm* — Schwegman, Lundberg & Woessner, P.A.

(57) ABSTRACT

Methods of forming cobalt-doped indium-tin oxide structures are shown. Properties of structures include transparency, conductivity, and ferromagnetism. Monolayers that contain indium, monolayers that contain tin, and monolayers that contain cobalt are deposited onto a substrate and subsequently processed to form cobalt-doped indium-tin oxide. Devices that include oxide structures formed with these methods should have better step coverage over substrate topography and more robust film mechanical properties.

21 Claims, 4 Drawing Sheets

OTHER PUBLICATIONS

Sneh, Ofer , "Thin film atomic layer deposition equipment for semiconductor processing", *Thin Solid Films*, 402(1-2), (2002),248-261.

Stankiewicz, J , et al., "Ferromagnetism in cobalt-doped indium-tin oxide films", *International Conference on Magnetism*, Kyoto, Japan,(2006), 1 pg.

* cited by examiner

COBALT-DOPED INDIUM-TIN OXIDE FILMS AND METHODS

TECHNICAL FIELD

This application relates generally to ferromagnetic films, transparent conducting oxide films, fabrication methods, and electronic devices in which such films or structures are used.

BACKGROUND

Conducting oxides including transparent conducting oxides (TCOs) are extensively used in electronic applications. Some example applications for transparent conducting oxides include liquid crystal displays (LCDs), organic light emitting diodes (OLEDs), photovoltaic cells, etc. Presently, indium-tin oxide (ITO) is widely used because of its high transparency, low resistivity, and high work function. Cobalt-doped indium-tin oxide provides improved conductivity. Cobalt-doped indium-tin oxide further exhibits ferromagnetic properties.

However, cobalt-doped indium-tin oxide formation presents a number of technical hurdles, including cost effective formation, interface control, chemistry control, microstructure, etc. Operational characteristics such as electrical and magnetic characteristics can be affected greatly by different formation methods. For example, sputtering does not provide the quality, ease of manufacture, and cost necessary for some device applications.

What are needed are methods to form cobalt-doped indium-tin oxide films that produce improved structures with improved properties. What are also needed are improved cobalt-doped indium-tin oxide films, structures, etc. and devices utilizing these structures to take advantage of the improved properties.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "wafer" and "substrate" used in the following description include any structure having an exposed surface with which to form an electronic device or device component such as a component of an integrated circuit (IC). The term substrate is understood to include semiconductor wafers. The term substrate is also used to refer to semiconductor structures during processing and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term insulator or dielectric is defined to include any material that is less electrically conductive than materials referred to as conductors. The term transparent is defined as a property of a material that transmits a substantial portion of incident electromagnetic energy in a given frequency range. Examples of electromagnetic energy ranges include visible frequency light, infrared, ultraviolet, etc. or combinations of frequency ranges. The term monolayer is defined as a material layer that is substantially one molecule thick. In some embodiments, one molecule includes one atom, while other molecules are comprised of several atoms. The term monolayer is further defined to be substantially uniform in thickness, although slight variations of between approximately 0 to 2 monolayers results in an average of a single monolayer as used in description below.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
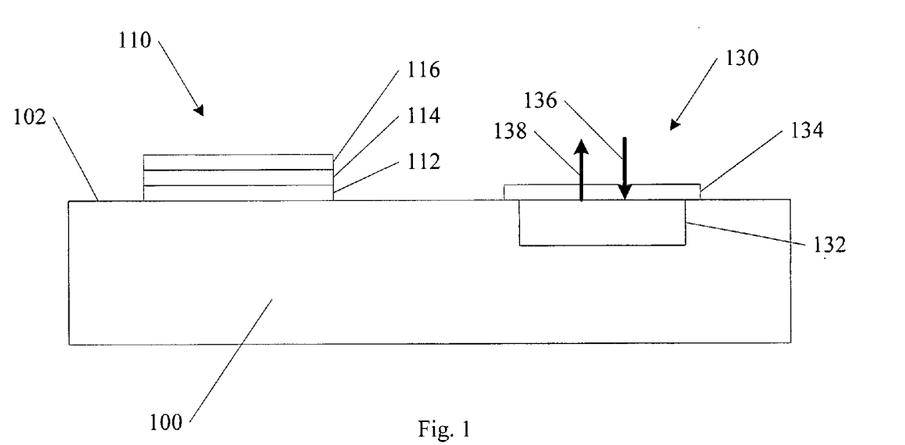
FIG. 1 shows a surface of an electronic device in a stage of processing according to an embodiment of the invention.

FIG. 1 shows a substrate 100 and substrate surface 102 of an electrical device such as a semiconductor based device. An electronic device 130 is also shown in a rough block diagram form in FIG. 1. Examples of electronic devices 130 include optical electronic devices such as active pixel sensors, photovoltaic devices, light emitting diode (LED) devices, plasma display screen devices etc. Other devices that benefit from adjacent strictures with optical transparency are within the scope of the invention.

FIG. 1 shows a deposited transparent conducting oxide layer 134 including cobalt, indium, and tin formed over the surface 102. In one embodiment, the transparent conducting oxide layer 134 includes a cobalt-doped indium-tin oxide layer. The layer 134 is shown covering at least a base portion 132 of the electronic device 130.

FIG. 1 further illustrates an incoming beam 136 of electromagnetic energy such as visible frequency light, UV light, etc. Selected devices within the scope of the invention include devices such as solar cells, gas sensor components, active pixel sensors, etc. that benefit from the ability to receive the incoming beam through a transparent layer 134. FIG. 1 also illustrates an outgoing beam 138. Selected devices within the scope of the invention likewise include devices such as light emitting diodes, plasma display screen emitters, etc. that benefit from the ability to transmit an outgoing beam through a transparent layer 134. One use of transparent conducting oxides in conjunction with devices such as these includes interconnection circuitry between devices, to an edge of an array or a chip, to a power supply, etc. Another use of transparent conducting oxides in conjunction with devices such as these includes conducting layer components of devices themselves.

FIG. 1 also shows a stack 110 formed on the substrate 100. A first ferromagnetic layer 112 and a second ferromagnetic layer 116 are shown separated by a non-ferromagnetic layer 114. In one embodiment, at least one of the ferromagnetic layers 112, 116 include a cobalt-doped indium-tin oxide layer. One usage of the stack 110 includes forming a spintronic device. Examples of spintronic devices include spin valves, giant magnetoresistive (GMR) components, magnetic random access memory (MRAM) cells, etc. Interconnecting circuitry is not shown in FIG. 1. One of ordinary skill in the art will recognize that components such as electronic device 130 and stack 110 are connected to other components using suitable circuitry to form higher level devices.

Although the stack 110 in FIG. 1 illustrates only two ferromagnetic layers and one non-ferromagnetic layer, the invention is not so limited. Multiple laminates, also within the scope of the invention.

The transparent conducting oxide layer 134 is formed using monolayer deposition methods as described in embodiments below. In one embodiment, at least one of the ferromagnetic layers 112, 116 are formed using monolayer deposition methods as described in embodiments below. Methods include atomic layer deposition (ALD) techniques, chemically self-limiting techniques, or other techniques that form monolayers with controlled thickness. As defined above, the term monolayer defines a layer that is substantially one molecule or one atom thick. Although substantially one layer thick, some variation on the order of 0 to 2 molecules is within the scope of the invention.

The methods described form a unique structure compared to other deposition methods. Using monolayer deposition methods described below, a transparent conducting oxide structure can be formed with step coverage over surface topography that is superior to other deposition techniques such as conventional CVD, MBE, sputtering, etc. Although electronic device 130 and stack 110 are shown in FIG. 1 on an exposed horizontal surface, in selected embodiments, devices such as these are formed on more difficult topography such as trenches where improved step coverage is highly beneficial.

Selected monolayer processing methods can provide a substantially amorphous transparent conducting oxide structure that is more difficult to form using other deposition techniques. Other processing variations provide a fine crystal distribution such as a nanocrystalline transparent conducting oxide structure. Micro-scale and nano-scale crystal structures provide unique physical properties such as highly durable films, and provide unique electrical properties due to conduction mechanisms through crystals, etc.

Figure 2:
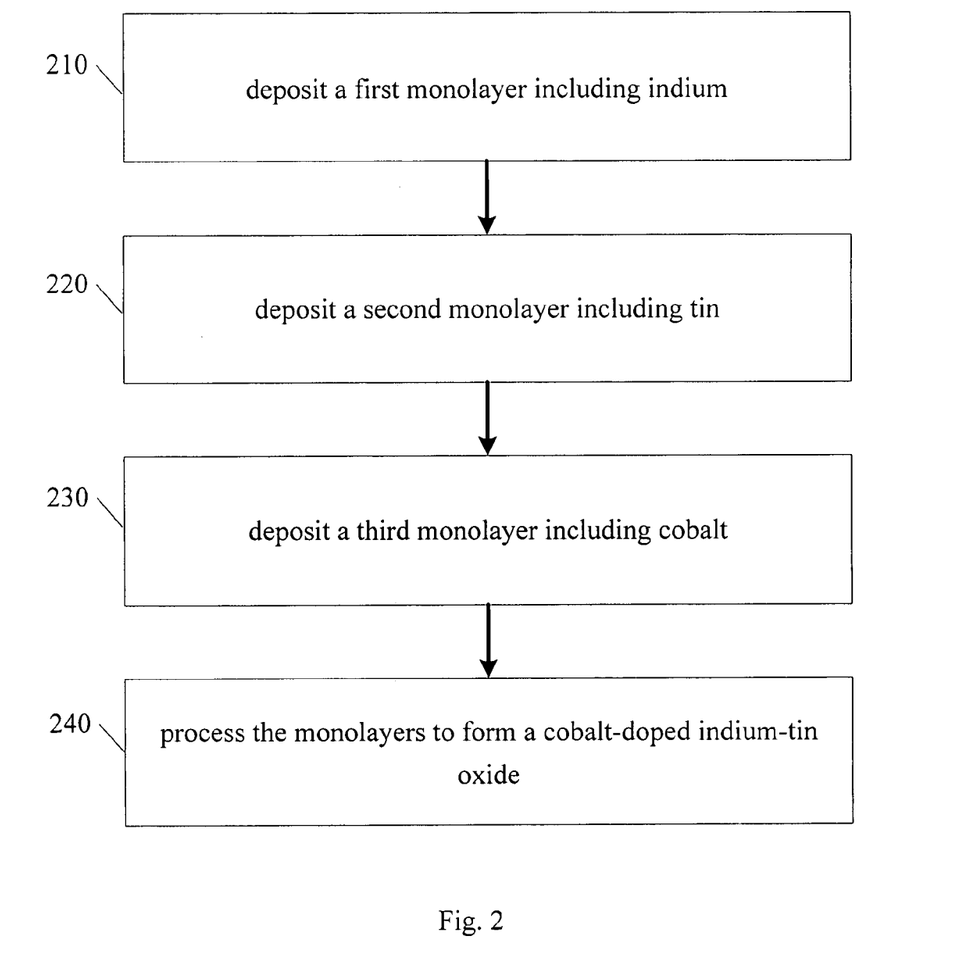
FIG. 2 shows a method of forming a material layer or structure according to an embodiment of the invention.

FIG. 2 shows a flow diagram of an example method of forming a transparent conducting oxide according to an embodiment of the invention. In operation 210, a monolayer that includes indium is deposited. In one embodiment, the first monolayer is indium oxide. One example of indium oxide includes $In_2O_3$. In one embodiment the monolayer is indium metal.

In operation 220, a monolayer that includes tin is deposited. In one embodiment, the second monolayer is tin oxide. One example of tin oxide includes $SnO_2$. In one embodiment the monolayer is tin metal. In operation 230, a monolayer that includes cobalt is deposited. In one embodiment the monolayer is metallic cobalt although other layers that contain cobalt are within the scope of the invention.

A plurality of layers including indium containing layers, tin containing layers, cobalt containing layers can be built up to form a stack or laminate structure. More layers can be used to form thicker structures. Further, as discussed in more detail below, the relative number of each layer can be adjusted to provide any desired ratio between indium, tin, and coblat. By using monolayer deposition, the thickness and/or the ratio between layer materials is precisely controlled. Although three layers including indium, tin, and cobalt are described, the invention is not so limited. Other layers are also included in selected embodiments to provide additional chemical and structural options.

In operation 240, the layers in the stack are processed to form an oxide structure. As described above, uses for the oxide structure include transparent conducting oxide layers, ferromagnetic layers, etc. Processing of compound layer embodiments such as $In_2O_3/SnO_2/Co$ includes annealing or activating diffusion processes to mix the layers and provide a cobalt-doped indium-tin oxide. Processing of metal layer embodiments such as In/Sn/Co includes oxidizing the layers and mixing the layers to provide a cobalt-doped indium-tin oxide. In one embodiment mixing includes processes such as annealing, which is another term for diffusion mixing. Other embodiments include depositing both a metal layer and an oxide layer to form a stacked structure such as $In_2O_3/Sn/Co$ with subsequent processing to form a cobalt-doped indium-tin oxide. Final chemistry of the cobalt dopant and indium-tin oxide matrix will depend on the application of the oxide layer and any related electronic device.

Processing variables such as temperature and pressure, duration, etc. are chosen to tailor a desired structure morphology. For example, in one embodiment the individual layers in the stack are deposited in a substantially amorphous state. By processing at a low temperature, the amorphous characteristics of the original layer is substantially preserved, and the resulting transparent conducting oxide is substantially amorphous. Likewise, other processing variables can also be chosen to produce a micro-crystalline or nano-crystalline transparent conducting oxide microstructure. As mentioned above, microstructures such as nano-crystallinity provide enhanced properties such as improved film durability.

In one embodiment, a substantially amorphous stack of deposited layers are annealed at a temperature between approximately 300° C. and 450° C. to form a polycrystalline structure. An example dopant chemistry of approximately 13 atomic percent cobalt annealed in this temperature range provides a resistivity of around $1.2 \times 10^{-3}$ Ω-cm at 300K. In one embodiment, annealing a similar stack and dopant chemistry between approximately 450° C. and 600° C. provides a resistivity of around 0.2 Ω-cm at 300K.

Other properties of cobalt-doped indium-tin oxide structures formed using these methods include a magnetic moment of about 0.8 μB/Co ion for structures with approximately 13 atomic percent cobalt.

As discussed above, monolayer deposition of material layers provides a number of useful properties for transparent conducting oxide structures. One method of depositing monolayers includes atomic layer deposition (ALD). ALD is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favorable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for applications such as planar substrates, deep trenches, and in material deposition on porous materials, other high surface area materials, powders, etc. Examples include, but are not limited to porous silicon, alumina powders, etc. Significantly, ALD provides for controlling deposition thickness in a straightforward, simple manner by controlling the number of growth cycles.

The precursors used in an ALD process may be gaseous, liquid or solid. Typically, liquid or solid precursors are volatile. The vapor pressure must be high enough for effective mass transportation. Also, solid and some liquid precursors are heated inside the reaction chamber and introduced through heated tubes to the substrates. The necessary vapor pressure is reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other considerations for precursors used in ALD. Thermal stability of precursors at the substrate temperature is a factor because precursor decomposition affects the surface control. ALD is heavily dependent on the reaction of the precursor at the substrate surface. A slight decomposition, if slow compared to the ALD growth, can be tolerated.

The precursors chemisorb on or react with the surface, though the interaction between the precursor and the surface as well as the mechanism for the adsorption is different for different precursors. The molecules at the substrate surface react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction are typically gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse or chamber evacuation to remove excess precursor and by-products from the reaction chamber prior to pulsing the next precursor of the fabrication sequence.

Using RS-ALD, films can be layered in equal metered sequences that are essentially identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

RS-ALD provides for high continuity at an interface compared with other techniques such as CVD; conformality over difficult topography on a substrate; use of low temperature and mildly oxidizing processes; growth thickness dependent solely on the number of cycles performed, and ability to engineer multilayer stacked films with resolution of one to two monolayers. RS-ALD allows for deposition control on the order on monolayers and the ability to deposit monolayers of amorphous films.

RS-ALD processes provide for robust deposition of films or other structures. Due to the unique self-limiting surface reaction materials that are deposited using RS-ALD, such films are free from processing challenges such as first wafer effects and chamber dependence. Accordingly, RS-ALD processes are easy to transfer from development to production and from 200 to 300 mm wafer sizes in production lines. Thickness depends solely on the number of cycles. Thickness can therefore be dialed in by controlling the number of cycles.

Stacked structures of multiple layers formed using ALD can also be subsequently processed to mix the individual layers together. For example, a stack structure can be annealed to mix a plurality of different layers together, thus forming an alloy or a mixture of layer chemistries. By forming a stack structure using ALD, and subsequently mixing the layers, the chemistry of the resulting structure is precisely controlled. Because the stack is made up of self-limiting monolayers over a known surface area, the number of molecules from each individual layer are known to a high degree of accuracy. Chemistry can be controlled by adding or subtracting one or more layers in the stack. The resulting mixed layer chemistry will be substantially uniform. In selected material combinations small variations in chemistry may occur, such as at interfaces.

Figure 3:
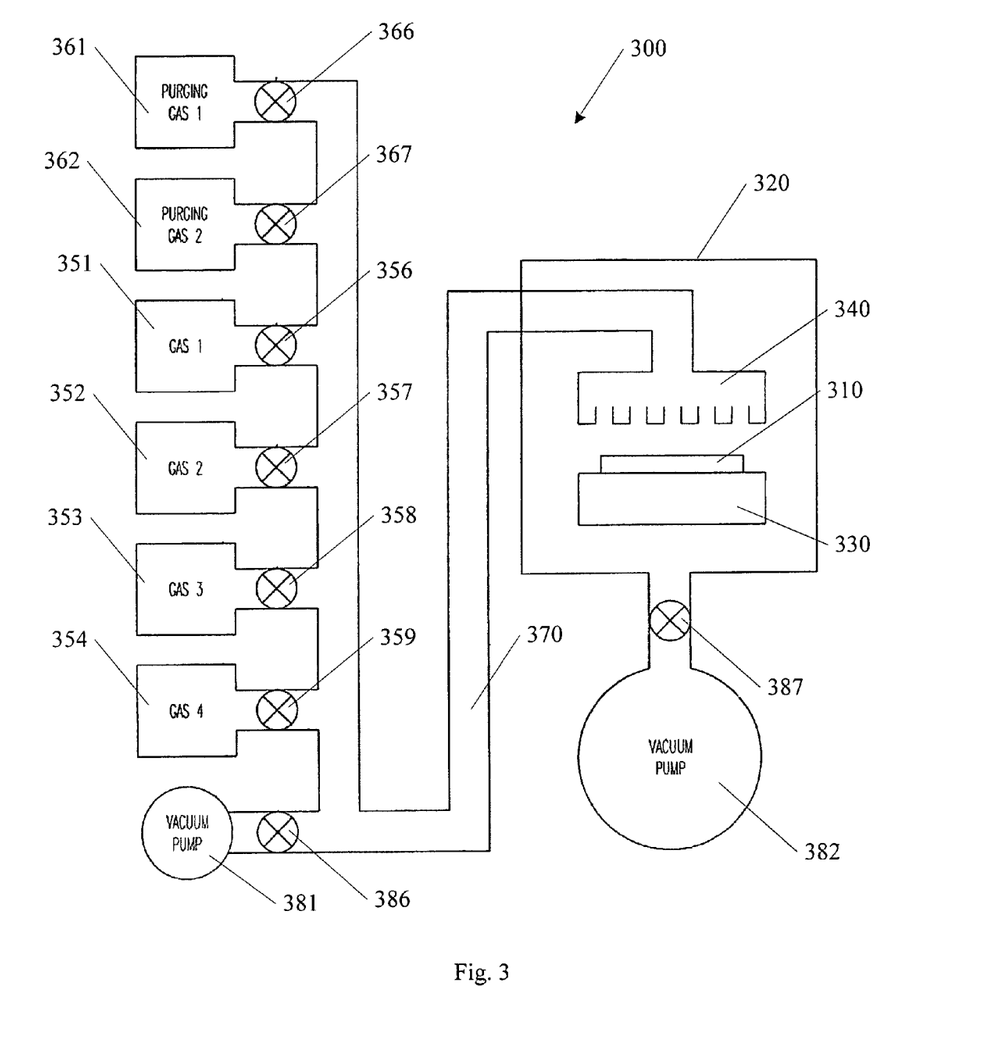
FIG. 3 shows a material deposition system according to an embodiment of the invention.

FIG. 3 shows an embodiment of an atomic layer deposition system for processing indium containing layers, tin containing layers, and cobalt containing layers. In FIG. 3, a substrate 310 is located inside a reaction chamber 320 of ALD system 300. Also located within the reaction chamber 320 is a heating element 330 which is thermally coupled to substrate 310 to control the substrate temperature. A gas-distribution fixture 340 introduces precursor gases to the substrate 310. Each precursor gas originates from individual gas sources 351-354 whose flow is controlled by mass-flow controllers 356-359, respectively. The gas sources 351-354 provide a precursor gas either by storing the precursor as a gas or by providing a location and apparatus for evaporating a solid or liquid material to form the selected precursor gas.

Also included in the ALD system 300 are purging gas sources 361, 362, each of which is coupled to mass-flow controllers 366, 367, respectively. The gas sources 351-354 and the purging gas sources 361-362 are coupled by their associated mass-flow controllers to a common gas line 370, which is sometimes also referred to as a gas conduit. The common gas line 370 is coupled to the gas-distribution fixture 340 inside the reaction chamber 320. Gas conduit 370 is also coupled to vacuum pump 381, which is sometimes also referred to as an exhaust pump, by mass-flow controller 386 to remove excess precursor gases, purging gases, and by-product gases at the end of a purging sequence from the gas conduit 370.

Vacuum pump, or exhaust pump, 382 is coupled by mass-flow controller 387 to remove excess precursor gases, purging gases, and by-product gases at the end of a purging sequence from the reaction chamber 320. For convenience, control displays, mounting apparatus, temperature sensing devices, substrate maneuvering apparatus, and necessary electrical connections as are known to those skilled in the art are not shown in FIG. 3. Although ALD system 300 is illustrated as an example, other ALD systems may be used.

Using ALD methods as described above there are a number of different precursor chemistries that can be used to form monolayers including indium, monolayers including tin, and monolayers including cobalt. One example chemistry for indium oxide includes $InCl_2$ and $H_2O$ as reactant gasses. In one example, self-limiting growth occurs at substrate temperatures ranging from 400° C. to 500° C.

One example of chemistry for tin oxide includes tin chloride ($SnCl_4$) reacted with water vapor. Suitable temperatures include a range between 150° C. to 430° C.

One example of cobalt deposition includes plasma enhanced atomic layer deposition from metal-organic precursors and $NH_3$ plasma. Example precursors for cobalt include cyclopentadienyl cobalt precursors such as $CoCp(CO)_2$ and $CoCp_2$.

Although a number of examples of precursors, oxidizers, etc. and process conditions are listed above, the invention is not so limited. One of ordinary skill in the art, having the benefit of the present disclosure will recognize that other chemistries and process conditions that form monolayers with indium, tin, and cobalt can be used.

Figure 4:
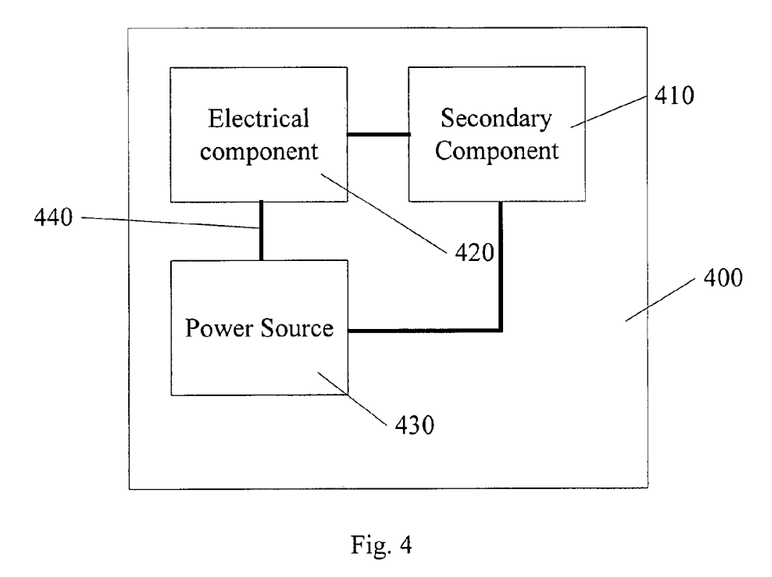
FIG. 4 shows a block diagram of an electronic device according to an embodiment of the invention.

FIG. 4 illustrates an electronic device 400 that includes an oxide structure formed using monolayer deposition methods such as ALD as described above. The electronic device 400 includes a first component 420 that benefits from transparent conducting structures. Examples of first component 420 includes LEDs, active pixel sensors, solar cells, a liquid crystal display (LCD) region, a controlled visibility region of a smart window, gas sensors, electroluminescent (EL) devices etc. In these examples, device operation is improved with transparency to electromagnetic energy such as visible wavelength light, infrared light, ultra violet light, etc.

In one embodiment, the device 400 further includes a power source 430. The power source 430 is electrically connected to the first component 420 using interconnecting circuitry 440. In one embodiment, the interconnecting circuitry 440 includes cobalt-doped indium-tin oxide formed as a transparent conducting oxide using methods described above. In addition to depositing material as described above, techniques such as lithography with masks, and/or etching etc. can be used to pattern conducting circuitry.

In one embodiment, the device 400 further includes a secondary component 410. The secondary component is electrically connected to the first component 420 using interconnecting circuitry. Likewise, in one embodiment, the interconnecting circuitry includes cobalt-doped indium-tin oxide formed as a transparent conducting oxide using methods described above. Examples of secondary components 410 include signal amplifiers, semiconductor memory, logic circuitry or other microprocessing circuits, etc. Aside from interconnecting circuitry, in one embodiment, the first component 420 and/or the secondary component 410 includes a cobalt-doped indium-tin oxide structure formed as a transparent conducting oxide using methods described above.

Figure 5:
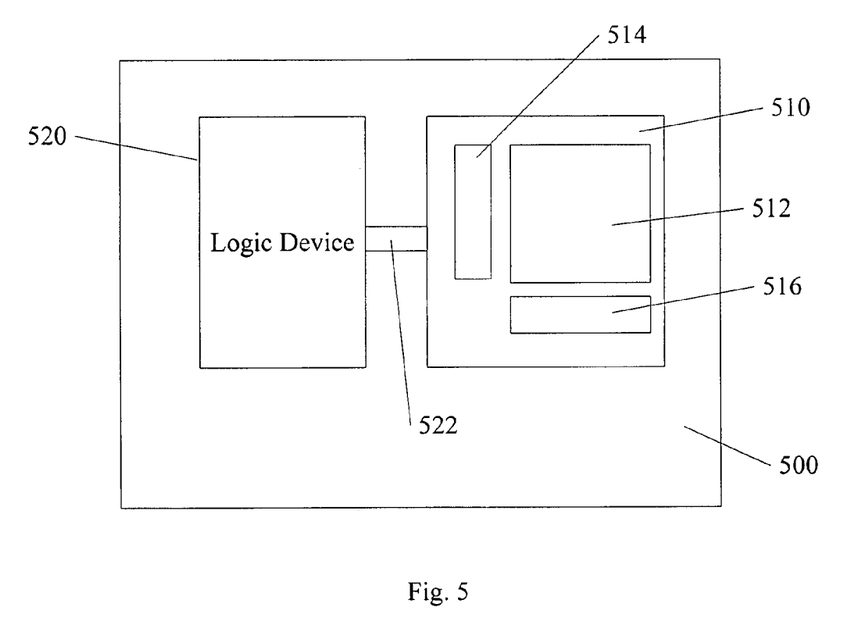
FIG. 5 shows a block diagram of an image sensor according to an embodiment of the invention.

FIG. 5 shows another example of an electronic device including transparent conducting oxides formed as described above. An imaging device 500 is shown. The imaging device includes an image sensor 510, with a pixel array 512. In one embodiment the pixel array 512 is coupled to additional row circuitry 514 and column circuitry 516. Examples of row and/or column circuitry includes drivers, amplifiers, decoders, etc. In one embodiment, the image sensor 510 is formed on a single semiconductor substrate using CMOS processes.

FIG. 5 further shows a logic device 520 coupled to a memory device 510 through circuitry 522. In one embodiment, the logic device 520 includes a programmable logic circuit. Other logic devices include microprocessors, etc. In one embodiment, the logic device 520 and circuitry 522 are formed on the same semiconductor substrate as the memory device 510. Using CMOS processing provides the ability to form a variety of different devices, such as logic, memory, etc. on a single substrate. Using monolayer deposition processes as described above, cobalt-doped indium-tin oxide device structures can be formed on a single substrate using CMOS processing equipment.

The memory device 510 is shown in FIG. 5 including an array of memory cells 512, with row circuitry 514 such as address circuitry, sense amplifiers, etc. Likewise, column circuitry 516 is also shown. In one embodiment, a spintronic structure such as a GMR device is incorporated into the array of memory cells 512 to form an MRAM device.

Although transparent conducting oxide applications and spintronic applications are discussed, other regions and structures of semiconductor chips and electronic devices where properties such as transparency, conductivity, and ferromagnetism are desired are within the scope of the invention.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A method of forming a conducting oxide component, comprising:
    forming a plurality of chemically adhered monolayers on a substrate, including:
        forming a first monolayer including indium;
        forming a second monolayer including tin;
        forming a third metallic cobalt monolayer;
    selecting a number of metallic cobalt monolayers to control cobalt chemistry in the conducting oxide component;
    processing the plurality of chemically adhered monolayers together as a layer stack to form a cobalt-doped indium-tin oxide, wherein processing includes;
    mixing the plurality of chemically adhered monolayers to form a substantially uniform chemical mixture of the monolayers.

2. The method of claim 1, wherein forming a first monolayer including indium includes forming an indium oxide monolayer.

3. The method of claim 1, wherein forming a second monolayer including tin includes forming a tin oxide monolayer.

4. The method of claim 1, wherein processing the plurality of chemically adhered monolayers includes oxidizing one or more metallic monolayers to form a cobalt-doped indium-tin oxide.

5. The method of claim 1, wherein mixing the plurality of chemically adhered monolayers includes annealing the plurality of chemically adhered monolayers, and wherein processing the plurality of chemically adhered monolayers includes processing substantially amorphous monolayers to form a polycrystalline cobalt-doped indium-tin oxide.

6. The method of claim 5, wherein processing the plurality of chemically adhered monolayers includes annealing at a temperature that forms a substantially nanocrystalline cobalt-doped indium-tin oxide.

7. A method of forming a giant magnetoresistive device, comprising:
   forming a first ferromagnetic layer and a second ferromagnetic layer separated from each other by a non-ferromagnetic layer;
   wherein at least one of the first and second ferromagnetic layers is formed by a plurality of chemically adhered monolayers, including:
      forming a first monolayer including indium;
      forming a second monolayer including tin;
      forming a third metallic cobalt monolayer;
      selecting a number of metallic cobalt monolayers to control cobalt chemistry in the first and the second ferromagnetic layers; and
      mixing the plurality of chemically adhered monolayers together as a layer stack to form a substantially uniform chemical mixture of the monolayers.

8. The method of claim 7, further including forming a microprocessor on the same substrate as the giant magnetoresistive device.

9. The method of claim 8, wherein forming a giant magnetoresistive device includes forming a spin valve.

10. The method of claim 8, wherein forming a giant magnetoresistive device includes forming a magnetic random access memory (MRAM) cell.

11. A method of forming an electrical device, comprising:
   forming a first electrical component on a substrate;
   forming a second electrical component electrically separate from the first electrical component;
   forming a cobalt-doped indium-tin oxide conducting structure between the first electrical component and the second electrical component, including:
      forming a plurality of chemically adhered monolayers, including:
         forming a plurality of individual first monolayers, each first monolayer including indium;
         forming a plurality of individual second monolayers, each second monolayer including tin;
         forming a plurality of individual third monolayers, each third monolayer being substantially pure metallic cobalt;
      selecting a number of third monolayers in the plurality of chemically adhered monolayers to control cobalt chemistry in the cobalt-doped indium-tin oxide conducting structure; and
      mixing the plurality of chemically adhered monolayers to form a chemical mixture of the monolayers.

12. The method of claim 11, wherein forming first monolayers including indium includes atomic layer deposition (ALD) of $In_2O_3$ monolayers.

13. The method of claim 12, wherein atomic layer deposition (ALD) of $In_2O_3$ monolayers includes oxidizing layers formed by an $InCl_2$ precursor.

14. The method of claim 11, wherein forming second monolayers including tin includes atomic layer deposition (ALD) of tin oxide monolayers.

15. The method of claim 14, wherein atomic layer deposition (ALD) of a tin oxide monolayers includes oxidizing a $SnCl_4$ precursor with $H_2O_2$.

16. The method of claim 11, wherein forming third monolayers of substantially pure metallic cobalt includes atomic layer deposition (ALD) of substantially pure metallic cobalt monolayers.

17. The method of claim 16, wherein atomic layer deposition (ALD) of the substantially pure metallic cobalt monolayers includes activating a cyclopentadienyl cobalt precursor chosen from a group consisting of $CoCp(CO)_2$ and $CoCp_2$.

18. A method of forming a magnetic memory device, comprising:
   forming an array of memory cells, each cell including a ferromagnetic cobalt-doped indium-tin oxide storage media, wherein forming the ferromagnetic cobalt-doped indium-tin oxide storage media includes:
      atomic layer depositing a plurality of monolayers one monolayer at a time, including:
         forming a first monolayer including indium;
         forming a second monolayer including tin;
         forming a third metallic cobalt monolayer;
      selecting a number of metallic cobalt monolayers to control cobalt chemistry in the cobalt-doped indium-tin oxide storage media; and
      mixing the plurality of monolayers together as a layer stack to form a chemical mixture of the monolayers.

19. The method of claim 18, wherein forming a ferromagnetic cobalt-doped indium-tin oxide storage media includes forming a giant magnetoresistive device.

20. The method of claim 18, wherein forming a first monolayer including indium includes forming an indium oxide monolayer.

21. The method of claim 20, wherein forming a second monolayer including tin includes forming a tin oxide monolayer.

* * * * *